(12) United States Patent
Delaunay et al.

(10) Patent No.: US 6,337,110 B1
(45) Date of Patent: Jan. 8, 2002

(54) PROCESS FOR THE DEPOSITION BY ELECTRON CYCLOTRON RESONANCE PLASMA OF ELECTRON-EMITTING CARBON FILMS UNDER THE EFFECT OF AN ELECTRIC FIELD APPLIED

(75) Inventors: Marc Delaunay, Meylan; Marie-Noëlle Semeria, Nizier du Roucherotte, both of (FR)

(73) Assignee: Commissariat a l' Energie Atomique, Paris (FR)

( * ) Notice: Subject to any disclaimer, the term of this patent is extended or adjusted under 35 U.S.C. 154(b) by 0 days.

(21) Appl. No.: 09/330,871

(22) Filed: Jun. 11, 1999

(30) Foreign Application Priority Data

Jun. 24, 1998 (FR) .............................. 98 07993

(51) Int. Cl.⁷ .............................. C23C 16/26
(52) U.S. Cl. .................. 427/571; 427/577; 427/573; 427/575; 427/249.6; 427/255.5
(58) Field of Search .............................. 427/249.7, 577, 427/571, 573, 575, 904, 255.5, 249.6; 423/446

(56) References Cited

U.S. PATENT DOCUMENTS

| | | | | |
|---|---|---|---|---|
| 4,645,713 A | * | 2/1987 | Shioya et al. ................ | 428/457 |
| 5,039,548 A | * | 8/1991 | Hirose et al. ................ | 427/577 |
| 5,358,741 A | | 10/1994 | Gat | |
| 5,378,507 A | * | 1/1995 | Ohba et al. .................. | 427/534 |
| 5,506,475 A | * | 4/1996 | Alton .................... | 315/111.41 |
| 5,695,832 A | * | 12/1997 | Hirano et al. ................ | 427/577 |

OTHER PUBLICATIONS

Patent Abstracts of Japan, Publication No. 06280019.
Patent Abstracts of Japan, Publication No. 04238897.
Patent Abstracts of Japan, Publication No. 63083271.
Patent Abstracts of Japan, Publication No. 03267375.
XP–002096290.
XP–002096291.
Flat panel display prototype using low–voltage carbon field emitters, 8257b Journal of Vacuum Science & Technology B, 13(1995)Mar./Apr. No. 2, New York NY., US.
Hawley's Condensed Chemical Dictionary, 11th Edition, 1987, p. 576 (no month).*
Pierson, Handbook of Chemical Vapor Deposition (CVD) Noyes Publications, p. 179, 1992.*
Kuo et al, Appl. Phys. lett. 59 (20) pp. 2532–2534, Nov. 1991.*

* cited by examiner

*Primary Examiner*—Timothy Meeks
(74) *Attorney, Agent, or Firm*—Pearne & Gordon LLP

(57) ABSTRACT

The present invention relates to a process for electron cyclotron resonance plasma deposition of electron-emitting carbon films, in which by injecting a microwave power into a plasma chamber incorporating an electron cyclotron resonance zone (9), ionization takes place of a gaseous mixture under a low pressure, the thus created ions and electrons diffusing along the magnetic field lines (6) to a substrate (3), the gaseous mixture comprising organic molecules and hydrogen molecules. Said process comprises the following stages:

heating the substrate (3), creating a plasma from the ionized gaseous mixture, creating a potential difference between the plasma and the substrate, diffusion of the plasma up to the substrate (3) which, by heating, has reached a temperature such that said electron-emitting material is deposited on the substrate.

13 Claims, 3 Drawing Sheets

PROCESS FOR THE DEPOSITION BY ELECTRON CYCLOTRON RESONANCE PLASMA OF ELECTRON-EMITTING CARBON FILMS UNDER THE EFFECT OF AN ELECTRIC FIELD APPLIED

TECHNICAL FIELD

The present invention relates to a process for the deposition by electron cyclotron resonance (ECR) plasma deposition of electron-emitting carbon films, under the effect of an electric field applied.

PRIOR ART

Electron-emitting carbon films can be logically classified in accordance with the three following structures: diamond, DLC (diamond like carbon) and graphite. In reality, a deposited film can contain mixed structures, e.g.:
diamond crystals films with graphite inclusions,
graphite crystal films with diamond inclusions.
This classification then corresponds to the main structre.

In the prior art devices, independently of the emission of electrons, particular research has been carried out in the fields:
of synthesizing diamond films for mechanical, optical and electrical properties of the diamond, at temperatures generally between 400 and 1000° C.,
the production of carbon films of DLC type (diamond like carbon), generally at low temperature (20 to 400° C.) and with a high level of C—C $sp_3$ bonds, particularly for mechanical properties. Such films are mainly amorphous.

Table I, at the end of the description, reveals various devices and processes for the vacuum deposition of carbon films used at present for emissive carbon. The devices and processes considered are described in the documents given at the end of the description.

The table reveals two deposition mechanisms. A deposition of the chemical vapour deposition (CVD) type, in which a gas of organic molecules (often methane) is introduced mixed, with or without hydrogen, into a device making it possible to break the C—C, C—H and H—H bonds by electron impact with, e.g. the use of a hot filament, the introduction of a microwave power, the use of a radiofrequency (RF) polarization or the use of an electron cyclotron resonance (ECR). As a function of the device used, the operating pressure is high (filament, microwaves, radiofrequency) or low (ECR, RF). The lower the pressure the greater the dissociation and ionization of the particles. The energy to be supplied for bringing about the transformation reaction of the gas into solid is greatly decreased by the breaks of covalent bonds (e.g. $CH_4$) of the organic molecules. It is consequently possible to obtain crystal structures (graphite or diamond) at lower substrate temperatures (e.g. 400° C. instead of 800° C.). The polarization of the substrate also makes it possible to aid crystallization at a lower temperature permitting the use of a wider range of substrates.

A direct deposition of carbon ions or atoms, which can be carried out by the sputtering of a graphite target, by arc, by laser ablation, ion beam or evaporation. The quality and structure of the films are essentially dependent on the energy of the incident carbon atoms or ions for a given temperature.

The carbon films investigated for their electron emission properties by field effect in the prior art devices, correspond to one of the three following films:

A diamond crystal film with a non-negligible, graphitic, amorphous structure level ("pure" diamond would not appear to emit): the main problem is then the bringing about of a low temperature deposition on large surfaces. An important constraint is constituted by the use of a very small proportion (1%) of methane (or other organic molecules) compared with a large hydrogen quantity useful for the growth of the diamond, with a minimum temperature of 400° C. It is often necessary to produce precursor sites.

A DLC carbon film with a high C—C $sp_3$ bond level: an important constraint is then the energy necessary for the incident carbon atoms or ions (approximately 100 eV) for producing such films. Certain devices, intrinsically, cannot carry out deposits over large dimensions (laser ablation, arc). This possibility has to be demonstrated for RF devices.

A varied graphite film, with or without diamond crystal inclusions.

The following technical constraints arise with such a process for the deposition of these emitting carbon films:

These electron emitting films must be implemented on large surfaces (possibly up to 1 $m^2$) at low cost and with a good homogeneity of deposition and emission.

The temperature of the deposit must be below 600° C. for the use of standard glass substrates.

The emission threshold field, defined as the electric field to be applied for measuring an electron current of 0.1 $\mu A$, must be low (approximately 10 $V/\mu m$), with a possibility of a lowering of this threshold by doping.

The carbon films must be stable during the different screen production stages, particularly during the different annealing operations, as well as during the operation of the screen, the emission of the film then being activated by an electric field.

The present invention relates to a process for the electron cyclotron resonance plasma deposition of electron-emitting material films under the effect of an electric field applied, which can be applied to large surfaces, typically of approximately 1 $m^2$. The present invention corresponds to the last type of structure defined hereinbefore, with a C—C $sp_3$ bond level of typically 10 to 30% implemented at an average temperature of 300 to 80° C. and at a low pressure of approximately $5 \times 10^{-4}$ mbars using CVD.

The present invention describes a deposition process for obtaining electron-emitting films, known that a prior substrate preparation phase must be added in order to aid the adhesion of the film or modify the type of interface bonds.

This prior phase can comprise a sputtering stage or a deposition stage with specific polarization and pressure conditions and an adequate choice of one or more gases.

DESCRIPTION OF THE INVENTION

The present invention relates to a process for the deposition by electron cyclotron resonance plasma of electrically conductive, electron-emitting carbon films, in which by the injection of a microwave power into a plasma chamber incorporating an electron cyclotron resonance zone, ionization takes place of a gaseous mixture under a low pressure of $10^{-4}$ to $10^{-3}$ mbars, the thus created ions and electrons diffusing along magnetic field lines to a substrate, characterized in that the gaseous mixture comprises organic molecules and hydrogen molecules and in that said process comprises the following stages:

heating the substrate, creating a plasma from the ionized, gaseous mixture for a value of the magnetic field corresponding to the electron cyclotron resonance of the organic molecules, creating a positive potential difference between the substrate and the plasma, a positive or zero polarization being applied to the substrate, a diffusion of the plasma to the substrate, said substrate having reached, by heating, a temperature such that the electron-emitting material is deposited on the substrate.

In an advantageous embodiment these different stages are performed simultaneously.

Advantageously, the electron-emitting material is graphitic carbon with a minority proportion of $sp_3$ bonds. The substrate temperature is advantageously between 300 and 800° C.

The carbon films are advantageously constituted by a graphite matrix with inclusion of diamond crystals.

The substrate can be heated by electron bombardment or by an external heating device. The organic gas can be methane, methanol, acetylene, etc.

Advantageously the microwave power is injected at a frequency of 2.45 GHz. The substrate is positively polarized between typically +50 and +200 volt. The plasma is advantageously polarized by the plasma chamber at −50 volt, the substrate being earthed or grounded.

It is possible to vary the proportion of organic molecules compared with the hydrogen in the gaseous mixture by a few % to 100%.

The substrate can be of silicon, silicon covered with a conductive film, e.g. of molybdenum, or standard glass covered with a conductive film, e.g. of molybdenum.

One of the main applications of the process according to the invention is that of producing large size, flat, field effect screens, where the carbon acts as an electron source, advantageously replacing metallic micropoints.

DETAILED DESCRIPTION OF EMBODIMENTS

Figure 1:
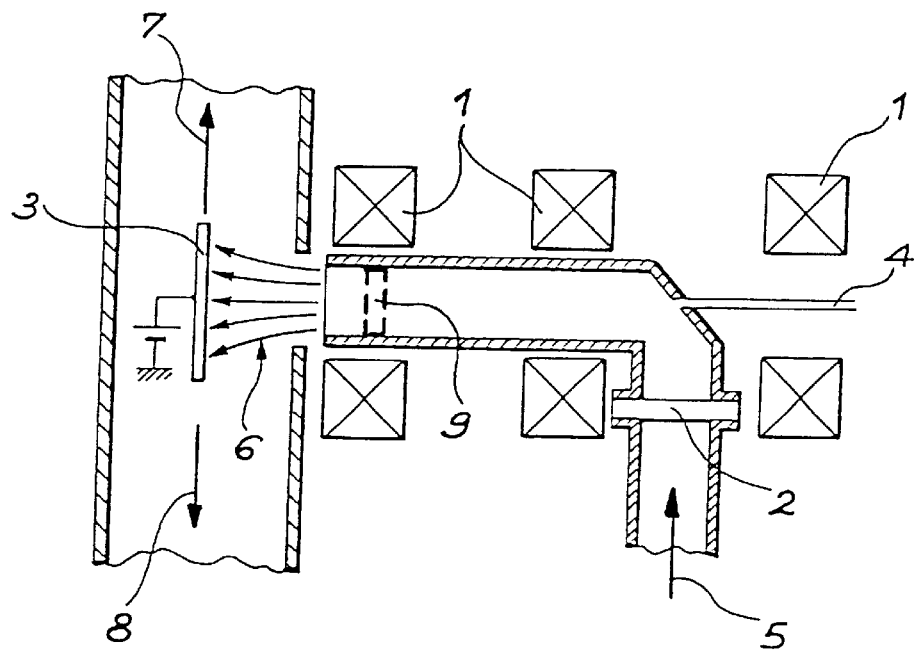
FIG. 1 illustrates a first type of electron cyclotron resonance plasma source having rectangular coils making it possible to perform the process according to the invention, the substrate performing a unidimensional movement.

FIG. 1 illustrates an ECR plasma source with rectangular coils in a plan view.

FIG. 1 shows a plasma chamber with rectangular coils 1, a microwave window 2, a substrate 3, which is positively polarized and a gaseous mixture injection duct 4. The arrows also indicate the microwave injection 5, the diffusion of the plasma 6, the movement of the substrate 7 and the pumping 8. Zone 9 is the ECR zone. Such a source makes it possible to implement the process of the invention.

Thus, the invention relates to a process for the deposition by electron cyclotron resonance of electron-emitting material films, e.g. of carbon, in which by injecting microwave power into the plasma chamber, the gaseous mixture is ionized under a low pressure of $10^{-4}$ to $10^{-3}$ mbars, the thus created ions and electrons diffusing along the magnetic field line 6 to the substrate 3, the gaseous mixture including organic molecules and hydrogen molecules. The process comprises the stages of heating the substrate 3, creating a plasma from the ionized, gaseous mixture for a magnetic field value corresponding to the electron cyclotron resonance of the organic molecules, the creation of a positive potential difference the plasma and the substrate and the diffusion of the plasma up to the substrate 3, which has reached, by heating, a temperature such that the electron-emitting material is deposited on the substrate.

Advantageously, these different stages are performed simultaneously.

The plasma contains neutral species ($CH_3$, CH, C . . . ) and ionized species ($CH^+_3$, $CH^+$, . . . $C^+$. . . ).

The introduction of the microwave power (advantageously at a frequency of 2.45 GHz) into the plasma chamber located within an adequate magnetic structure (as described in document [11] at the end of this description) produces the ionization of the organic and hydrogen molecules introduced at a low pressure.

Ionization takes place in the zone corresponding to the magnetic resonance field (875 Gauss if the wave frequency is 2.45 GHz) and the thus created plasma diffuses along the magnetic field lines to the positively polarized substrate (typically +50 to +200 V). Thus, the dissociation of the molecules $CH_4$ and $H_2$ takes place in the plasma and on the substrate (energy electron bombardment). The interest of using a low pressure, ECR plasma is the obtaining of a significant breaking of the C—H, C—C and C—H bonds (to obtain reactive $H^0$ atoms and $C^0$ atoms) in order to obtain graphite films (with diamond crystal inclusion) at the lowest possible temperature.

In an advantageous embodiment, the electron-emitting material is graphitic carbon with a minority proportion of $sp_3$ bonds. Deposition takes place at a substrate temperature between 300 and 800° C., at a low pressure (typically below $8 \times 10^{-4}$ mbars) of hydrogen and organic gas (methane, methanol or any organic molecule) permitting the production of large surface area, flat screens (1/4 to 1 $m^2$).

The device used is then a large-size, ECR plasma source constructed with magnetic field coils traversed by a current or by permanent magnets.

The substrate in the plasma diffusion zone is mainly positively polarized in order to complete the dissociation of the organic molecules and hydrogen on the substrate. Substrate heating serves to increase the diffusion of the atoms and crystallization.

In addition and advantageously, the plasma can be polarized at −50 V, the substrate being earthed for a simplified substrate movement.

The organic molecule or methane proportions introduced compared with the hydrogen can vary from a few % to 100%, the lower the organic molecule or methane proportion, the lower the threshold field.

The substrate can be heated by electron bombardment (positive polarization) or by an external system (e.g. a filament). The temperature range of 300 to 800° C. permits a deposition on glass substrates for flat screens.

The thickness of the films can vary from a few thousand Angstroms to a few micrometres on different conductive or semiconductor substrates, e.g. of silicon, silicon covered with a conductive film, e.g. molybdenum, standard glass covered with a conductive film, e.g. molybdenum, etc.

Thus, the process of the invention makes it possible to synthesize and use conductive graphite films produced by ECR plasma at low pressure and average temperature (300 to 800° C.).

Table II gives a few examples of emitting films illustrating the range of implementation of the process according to the invention (without doping). The electron emission threshold fields are similar for silicon substrates and silicon substrates covered with a conductive film, e.g. molybdenum. Unlike in the case of the synthesis of diamond films, which requires small proportions of $CH_4/H_2$ (generally 0.5 to 2%), in the process of the invention the $CH_4/H_2$ proportion can be between a few % and 100%, the lower the $CH_4/H_2$ ratio the lower the threshold field.

ECR microwave plasma devices for the deposition of such carbon films on large surfaces are shown in table III at the end of the description.

Figure 2:
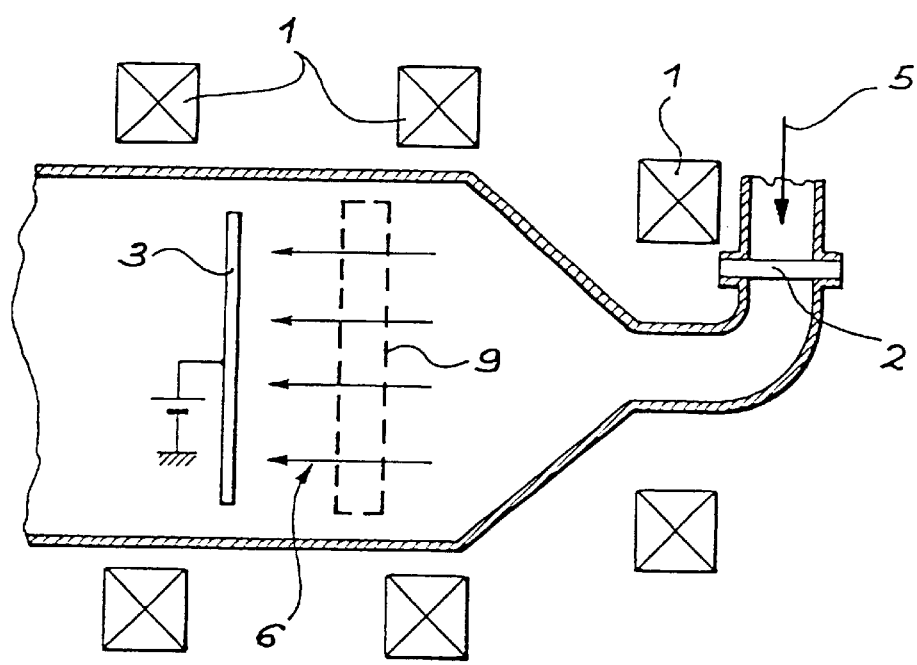
FIG. 2 illustrates a second type of electron cyclotron resonance plasma source permitting a large size, direct deposition without substrate movement.
Figure 4:
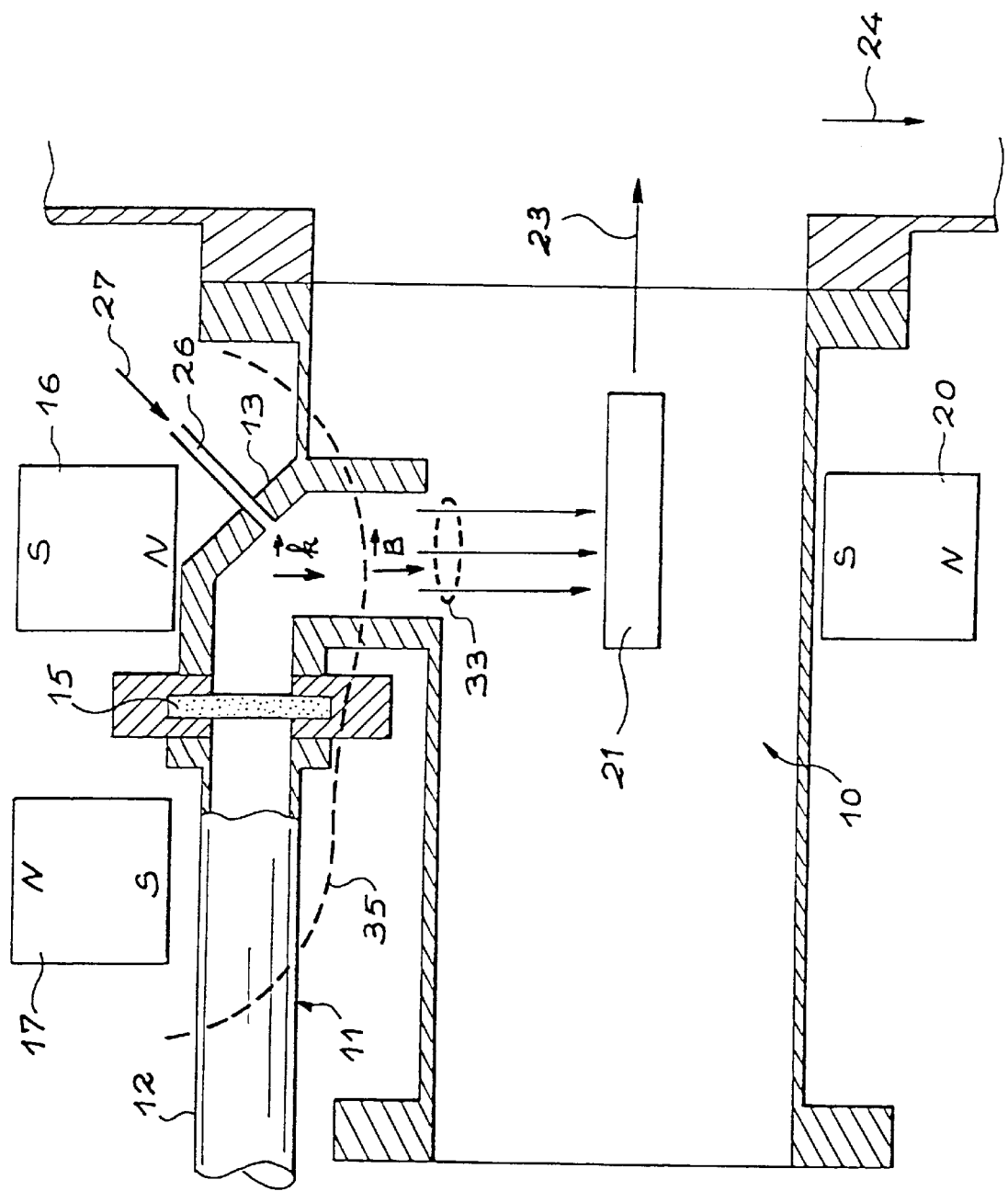
FIG. 4 illustrates a third type of electron cyclotron resonance plasma source using permanent magnets and a unidimensional substrate movement.

It is necessary to make a distinction between deposition devices with substrate movement (long, narrow plasma layers, as illustrated in FIG. 1) and systems directly permitting a large-size deposition (as illustrated in FIG. 2), where the references used in FIGS. 1 and 4 have been retained.

Figure 3:
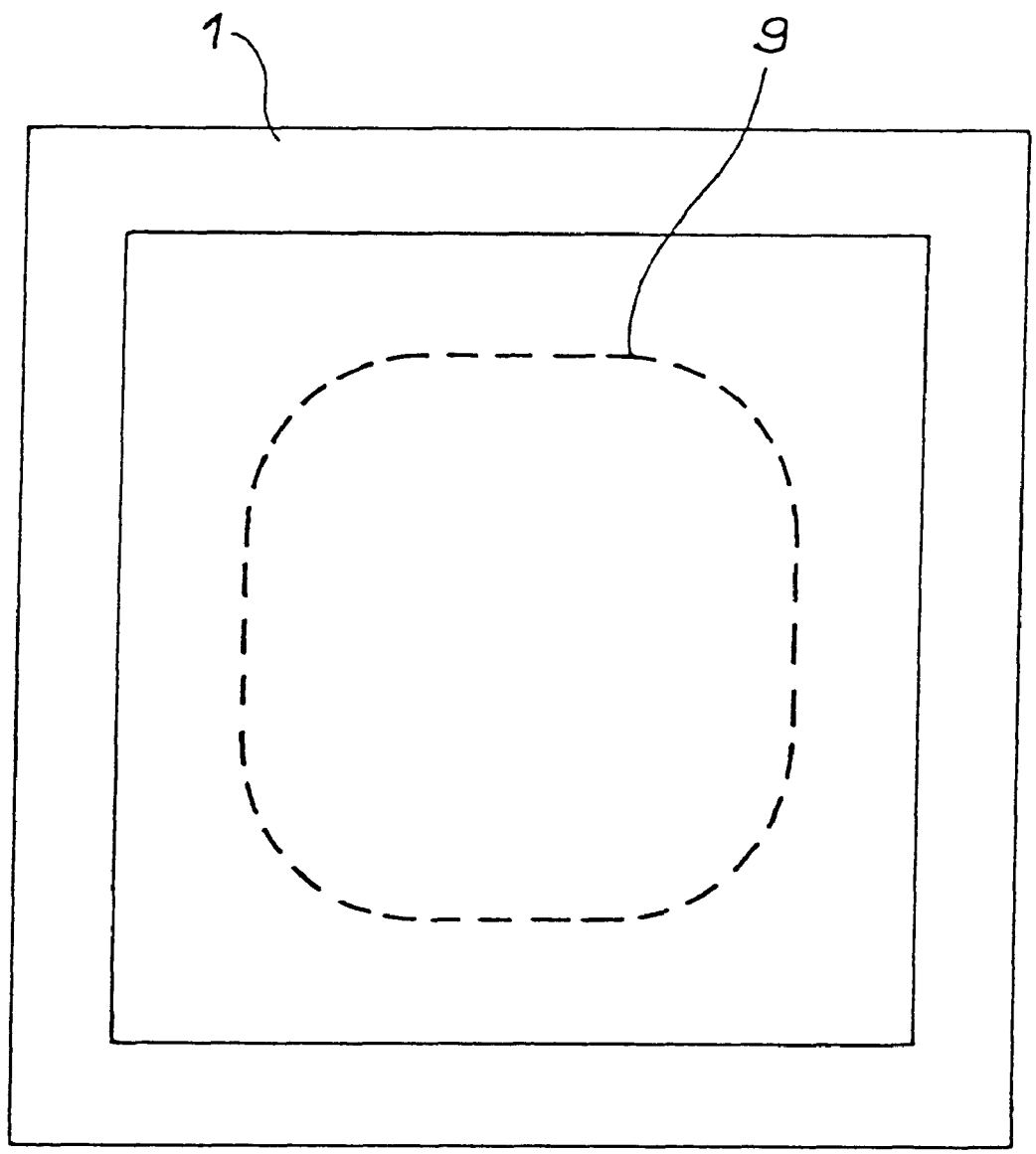
FIG. 3 illustrates the electron cyclotron resonance zone in the source illustrated in FIG. 2, created by large, magnetic field coils.

FIG. 3 illustrates the ECR zone, between two square coils, e.g. internal turns of 60×60 cm$^2$, said zone then being homogeneous over a surface S~40×40 cm$^2$.

The dimensions of the deposit are mainly dependent on the ECR magnetic field surface implementable with solenoids, square or rectangular, magnetic field coils, as describes in document [4], or permanent magnets. The plasma diffuses from the ECR zone to the substrate following the magnetic field lines (very few collisions take place at these low pressures in the diffusion). The magnetic flux is conservative. For a constant magnetic field ($B_{substrate} \sim B_{ECR}$), the homogeneous deposition surface is substantially equal to the ECR surface. On reducing the $B_{substrate}$ field, the homogeneous deposition surface increases with the plasma density, which decreases.

The devices considered advantageously have microwave sealing windows at 90° beyond the axis of the plasma to avoid any overlap of the microwave windows and so as to permit a continuous operation of the device.

In the rectangular, magnetic field coil devices illustrated in FIG. 1, it is possible to obtain a plasma height of 25 cm, which can be extended to 1 m if necessary. The electron cyclotron resonance zone is created at the end of the waveguide under vacuum. The magnetic field maximum is 0.25 Tesla at the injection level (microwave window and bend) and decreases to the ECR at 0.0875 Tesla. The main disadvantage of this device is the high electrical consumption (20 to 40 kW).

In the device illustrated in FIG. 2, use is made of square solenoids with a side length of 40 cm permitting a direct deposition of approximately 40×40 cm$^2$, without movement. The microwave injection is of the transition (cornet) type with a cross-section change, e.g. from S1=8 cm×8 cm to S2=50 cm×50 cm or by the juxtapositioning of several elementary guides. The main disadvantage of this type is the high electrical consumption (30 to 80 kW).

The depositions with movement implemented with a system consisting solely of permanent magnets are illustrated in FIG. 4, where the plasma source is constituted by a vacuum enclosure 10, a group of permanent magnets 16, 17 and 20 creating a given magnetic configuration and generating a plasma layer in the enclosure, and a coupler 11 distributing within the enclosure the power generated by one or more microwave emitters. This power injection into the enclosure 10 produces the ionization of a gas under low pressure. Said gas 27 can be injected by a duct 26.

The coupler 11 comprises a microwave injection guide 12 terminated by a 90° bend 13, which is connected to the enclosure 10 perpendicular thereto. A microwave sealing window 15, e.g. of quartz, is placed between the admission waveguide 12 and the bend 13.

The ECR zone is represented by a broken line 35, the value of said resonance being equal to ECR1 in the microwave injection guide 12, which is an air guide, and ECR2 in bend 13, which is under vacuum, the arrow 24 illustrating the pumping in the enclosure 10.

A substrate 21 polarized positively or to earth is located in the diffusion plasma. This substrate 21, e.g. moved by a rectilinear displacement 23, can be cooled by a cooling circuit.

The first and second permanent magnets 16 and 17 are placed on either side of the window 15 and are installed with an alternation of N-S (north-south) or S-N (south-north) poles.

The first magnet 16 creates a magnetic field $\vec{B}$ parallel to the microwave propagation $\vec{k}$. It creates an ECR2 modulus field in the bend 13 downstream up to the desired location. Combined with the second magnet 17, it creates a strong field at the window 15.

The third magnet 20 is located on the other side of the cavity 10 at the same level as the first magnet 16. It is used for bringing the field lines onto the substrate 21, thus increasing the ionic sputtering density. Thus, the magnetic field lines converge towards the substrate 21 to obtain the highest possible ion density thereon. The diffusion of the plasma 33 follows the magnetic field lines and the current density is approximately proportional to the magnetic field (the magnetic flux and total current are maintained along the diffusion). If there was no flux repetition or return due to said third magnet 20, the field lines would diverge and consequently the plasma density would decrease.

The injection of a microwave power into the waveguide 12 through the sealing window 15 brings about the ionization of the gas in the ECR zone 35 located at a few centimetres within the bend 13 under vacuum. The thus created plasma diffuses along the magnetic field lines to the substrate 21 (typically polarized from +50 to +200 V). The electrons are accelerated towards the substrate 21.

The main advantage of this configuration is its low cost and very low electrical consumption, linked solely with the microwave generator.

Unlike in the generally used electron cyclotron resonance devices, the aforementioned plasma sources simultaneously have large dimensions, with protected microwave windows (at 90°) and an operation under low pressure for increasing the dissociation of molecules of methane or other organic molecules and hydrogen.

BIBLIOGRAPHICAL REFERENCES

[1] "Field Emission From P-Type Polycrystalline Diamond Films" by D. Hong and M. Aslam (Journal "Le Vide, les Couches Minces", Supplement to No. 271, March-April 1994, pages 96 to 99)

[2] "Defect-Enhanced Electron Field Emission From Chemical Vapor Deposited Diamond" by W. Zhu, G. P. Kochanski, S. Jin and L. Seibles (Journal Applied Physics, 78(4), Aug. 15, 1995, pages 270 ff)

[3] "High-Sensitivity Absorption Spectroscopy on a Microwave Plasma-Assisted Chemical Vapour Deposition Diamond Growth Facility" by C. J. Erickson, W. B. Jameson, J. Watts-Cain, K. L. Menningen, M. A. Childs, L. W. Anderson and J. E. Lawler (Plasma Sources Sci. Technol. 5 (1996), pages 761–764

[4] "Fabrication of Diamond Films at Low Pressure and Low-Temperature by Magneto-Active Microwave Plasma Chemical Vapor Deposition" by Takuya Yara, Motokazu Yuasa, Manabu Shimizu, Hiroshi Makita, Akimitsu Hatta, Jun-Ichi Suzuki, Toshimichi Ito and Akio Hiraki (pn. J. Appl. Phys., vol. 33 (1994), pages 4404–4408, art. 1, No. 7B, July 1994)

[5] "Chemical Vapour Deposition of Diamond in RF Glow Discharge" by Seiichiro Matsumoto (Journal of Materials Science Letters 4 (1985), pages 600–602)

[6] "Field Emission From Tetrahedral Amorphous Carbon" by B. S. Satyanarayana, A. Hart, W. I. Milne and J. Robertson (Appl. Phys. Lett. 71 (10), Sep. 8, 1997, pages 1 to 3)

[7] "Nitrogen Containing Hydrogenated Amorphous Carbon for Thin-Film Field Emission Cathodes" by Gehan A. J. Amaratunga and S. R. P. Silva (Appl. Phys. Lett. 68 (18), Apr. 29, 1996, pages 2529 to 2531)

[8] "Electron Field Emission from Amorphous Carbon-Cesium Alloys" by S P. Bozeman, S. M. Camphausen, J. J. Cuomo, S. I. Kim, Y. O. Ahn and Young Ko (J. Vac. Sci. Technol. A 15 (3), May/June 1997, pages 1729 to 1732)

[9] "Electron Field Emission from Amorphous Tetrahedrally Bonded Carbon Films" by A. A. Talin, T. E. Felter, T. A. Friedmann, J. P. Sullivan and M. P. Siegal (J. Vac. Sci. Technol. A. 14(3), May/June 1996, pages 1719 to 1722)

[10] "High Quality Diamond Like Carbon Thin Film Fabricated by ECR Plasma CVD" by K. Kuramoto, Y. Domoto, H. Hirano, S. Kiyama and S. Tsuda (Applied Surface Science 113/114 (1997), pages 227–230)

[11] "ECR Plasma Ion Source for Material Depositions" by M. Delaunay and E. Touchais (Rev. of Sci. Instrum. February 1998, No. A97622)

[12] "Field Electron Emission from Highly Graphitic Diamond Film with Ball-Like Surface Morphologies" by Li Yunjun, He Jintian, Yao Ning and Zhang Binglin (Technical Digest of IVMC '97, Kyongju, Korea, 1997)

[13] "Flat Panel Displays Based Upon Low-Voltage Carbon Field Emitters" by A. Y. Tcherepanov, A. G. Chakhovskoi and V. V. Sharov ("Le Vide les Couches Minces", supplement to No. 271, March-April 1994)

[14] "La télévision due futur se met a plat" by Jean-Michel Le Corfec ("Sciences et avenir", April 1998, page 87)

TABLE I

Examples of carbon film deposits

| | Device | Ref. | Process | Substrate temp. (° C.) | Pressure (mbar) | % gas | Emission threshold field (V/$\mu$m) | Substrate polar. (V) |
|---|---|---|---|---|---|---|---|---|
| | hot filament | [1] | CVD | 800 to 1000 | 30 to 50 | 1% $CH_4/H_2$ | 20 | |
| | microwaves | [2] | CVD | 800 | | 1% $CH_4$ $C_2H_5OH$ | 22 to 50 | |
| DIAMOND | microwaves | [3] | CVD | 650 to 1100 | 20 to 100 | 0.5 to 3% $CH_4$ | | 0 to −300 |
| | ECR | [4] | CVD | 300 to 500 | $2 \times 10^{-2}$ to 2 | $CH_3OH$ or 0.5% $CH_4$ | | +30 |
| | RF | [5] | CVD | 700 to 1200 | 20 to 30 | 0.2 to 1% $CH_4/H_2$ | | |
| | Arc | [6] | ions $C^+$ | 20 | P II | without | 10 | 0 to −350 |
| | RF | [7] | PECVD | 20 | $10^{-3}$ to $3 \times 10$ | $CH_4$ or 10% $CH_4$ | 5 to 20 | −100 |
| DLC | ion source | [8] | $CO^+$ ion carbon sputtering | 20 20 | | | 17 | |
| | Laser | [9] | ablation → carbon plasma | 20 | | | 10 | |
| | ECR | [10] | CVD | 20 to 100 | $10^{-3}$ to $10^{-2}$ | 20% to 100% $CH_4$ | | −50 to −500 |
| | ECR | [11] | CVD | 400 to 600 | $6 \times 10^{-4}$ | $CH_4$ 10–50% $H_2$ | 10 to 30 | +100 |

TABLE I-continued

Examples of carbon film deposits

| | Device | Ref. | Process | Substrate temp. (° C.) | Pressure (mbar) | % gas | Emission threshold field (V/μm) | Substrate polar. (V) |
|---|---|---|---|---|---|---|---|---|
| GRAPHITE | Microwaves | [12] | CVD | 800 | 40 | 1% $CH_4$ 99% $H_2$ | 5 | |
| | Soot | [13] | soot sticking | 20 | | | | 20 |
| | Electrical discharge | [14] | CVD nanotubes | 900 | | $CH_4$ | | |

TABLE II

Examples of emitting films produced within the scope of the invention

| Raman peaks $cm^{-1}$ | % $CH_4$ | % $H_2$ | Total pressure (mbar) | Substrate polar. (V) | Substrate temp. (° C.) | Substrate | Threshold field (uV/m) | Structure | Microwave power (W) |
|---|---|---|---|---|---|---|---|---|---|
| 1346 | 5 | 95 | $7 \times 10^{-4}$ | +100 | ~600 | silicon | 10 | graphite | 600 |
| 1580* | 30 | 70 | $6 \times 10^{-4}$ | +60 | ~500 | Mo/Si | 15 | black graphite | 800 |
| 1610 | 30 | 70 | $6 \times 10^{-4}$ | +60 | ~400 | Mo/Si | 15 | white graphite | 600 |

*graphitic structure

TABLE III

ECR PLASMA DEVICES USED IN THE INVENTION FOR DEPOSITING BY FIELD EMISSION ELECTRON-EMITTING CARBON FILMS

| Large, circular or rectangular solenoids | Direct, with no substrate movement | [11] FIG. 3 | Large disks or rectangles | High 30–80 kW |
| Elongated, rectangular coils | Substrate movement | [11] FIG. 1 | Long, narrow rectangles (layers) | average 20 kW |
| Permanent magnets | Substrate movement | FIG. 4 | Long, narrow rectangles (layers) | Low (microwaves only) |

What is claimed is:

1. Process for electron cyclotron resonance plasma deposition of electrically conductive, electron-emitting graphitic carbon films, said carbon films having a minority proportion of $sp_3$ bonds, in which, by the injection of a microwave power into a plasma chamber incorporating an electron cyclotron resonance zone, a gaseous mixture is ionized in only an axial magnetic field under a low pressure of $10^{-4}$ to $10^{-3}$ mbars, the thus created ions and electrons diffusing along the magnetic field lines to the substrate, wherin the gaseous mixture comprises organic molecules and hydrogen molecules and wherein said process comprises the following stages:
   heating the substrate,
   creating a plasma from the ionized, gaseous mixture, for a magnetic field value corresponding to the electron cyclotron resonance of the organic molecules,
   creating a positive potential difference between the plasma and the substrate, a positive or zero polarization being applied to the substrate, and
   diffusing the plasma up to the substrate, which by heating has reached a temperature such that said electron-emitting material is deposited on the substrate.

2. Process according to claim 1, wherein the substrate temperature is between 300 and 800° C.

3. Process according to claim 1, wherein substrate heating takes place by electron bombardment or by an external heating device.

4. Process according to claim 1, wherein the organic gas is methane, methanol or acetylene.

5. Process according to claim 1, wherein the microwave power is injected at a frequency of 2.45 GHz.

6. Process according to claim 1, wherein the substrate is polarized between +50 and +200 Volt.

7. Process according to claim 1, wherein the plasma is polarized at −50 Volt, the substrate being earthed.

8. Process according to claim 1, wherein the proportion of organic molecules compared with hydrogen in the gaseous mixture is between a few % and 100%.

9. Process according to claim 1, wherein the substrate is of silicon, silicon covered with a molybdenum film, or standard glass covered with a molybdenum film.

10. Process according to claim 1, used for producing large-size, flat screens.

11. Process according to claim 1 wherein the substrate is moveable.

12. Process according to claim 11, further comprising the step of moving the substrate, in a direction substantially perpendicular to the direction of diffusion of the plasma, simultaneously with the diffusing step.

13. Process for electron cyclotron resonance plasma deposition of electrically conductive, electron-emitting carbon films, said carbon films being graphitic with a minority proportion of sp3 bonds, with the inclusion of diamond crystals, in which, by the injection of a microwave power into a plasma chamber incorporating an electron cyclotron resonance zone, a gaseous mixture is ionized in only an axial magnetic field under a low pressure of $10^{-4}$ to $10^{-3}$ mbars, the thus created ions and electrons diffusing along the magnetic field lines to the substrate, wherein the gaseous mixture comprises organic molecules and hydrogen molecules and wherein said process comprises the following stages:

heating the substrate, creating a plasma from the ionized, gaseous mixture, for a magnetic field value corresponding to the electron cyclotron resonance of the organic molecules, creating a positive potential difference between the plasma and the substrate, a positive or zero polarization being applied to the substrate, and diffusing the plasma up to the substrate, which by heating has reached a temperature such that said electron-emitting material is deposited on the substrate.

* * * * *